(12) United States Patent
Gardner et al.

(10) Patent No.: US 7,423,508 B2
(45) Date of Patent: Sep. 9, 2008

(54) CONTROL OF EDDY CURRENTS IN MAGNETIC VIAS FOR INDUCTORS AND TRANSFORMERS IN INTEGRATED CIRCUITS

(75) Inventors: Donald S. Gardner, Mountain View, CA (US); Gerhard Schrom, Hillsboro, OR (US); Peter Hazucha, Beaverton, OR (US); Fabrice Paillet, Hillsboro, OR (US); Tanay Karnik, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 137 days.

(21) Appl. No.: 11/479,240

(22) Filed: Jun. 30, 2006

(65) Prior Publication Data

US 2008/0001701 A1    Jan. 3, 2008

(51) Int. Cl.
*H01F 5/00*    (2006.01)
*H01F 7/06*    (2006.01)

(52) U.S. Cl. .............. 336/200; 336/223; 336/232; 29/602.1; 29/605

(58) Field of Classification Search ........... 336/200, 336/223, 232; 29/602.1, 605–606
See application file for complete search history.

(56) References Cited

U.S. PATENT DOCUMENTS

| | | | |
|---|---|---|---|
| 6,657,477 B2 * | 12/2003 | Hughes | 327/534 |
| 6,815,220 B2 * | 11/2004 | Crawford et al. | 438/3 |
| 6,856,226 B2 * | 2/2005 | Gardner | 336/192 |
| 6,856,228 B2 * | 2/2005 | Gardner | 336/200 |
| 6,891,461 B2 * | 5/2005 | Gardner | 336/200 |
| 2006/0097790 A1 * | 5/2006 | Bokatius | 330/289 |

* cited by examiner

*Primary Examiner*—Anh T Mai
(74) *Attorney, Agent, or Firm*—Kacvinsky LLC

(57) ABSTRACT

An embodiment is a magnetic via. More specifically, an embodiment is a magnetic via that increases the inductance of, for example, an integrated inductor or transformer while mitigating eddy currents therein that may limit the operation of the inductor or transformer at high frequency.

19 Claims, 11 Drawing Sheets

900

CONTROL OF EDDY CURRENTS IN MAGNETIC VIAS FOR INDUCTORS AND TRANSFORMERS IN INTEGRATED CIRCUITS

BACKGROUND

Inductors and transformers may be used in many different types of circuits. For example, they may be used for radio frequency (RF) circuits and high-frequency power distribution or conversion systems, such as a DC-DC voltage (or power) converter. Currently voltage converters may not be fully integrated on-chip for a variety of reasons. For example, a desired operating frequency may require an inductance value that is unobtainable based on the constrained physical size of the inductor or transformer. Further, in particular based on the effects of eddy currents, an on-chip inductor or transformer may not have a sufficiently high operating frequency for an RF or high-frequency voltage conversion application.

There are advantages to integrating a power system, for example including a DC-DC voltage converter, on the same die as the circuit(s) that are powered thereby. For example, as processor technology scales to smaller dimensions, supply voltages to circuits within a processor may also scale to smaller values. However, as the dimensions decrease, power consumption of the processor may increase. Using an off-die voltage converter to provide a small supply voltage to a processor with a large power consumption leads to a large total electrical current being supplied to the processor. This may increase the electrical current per pin, or the total number of pins required to power the processor as each pin has a maximum current handling capability. Also, an increase in supply current can lead to an increase in resistive as well as inductive voltage drop across various off-die and on-die interconnects, and to a higher cost for decoupling capacitors. Integrating the voltage converter onto the die may mitigate these and other problems.

DETAILED DESCRIPTION

Figure 1:
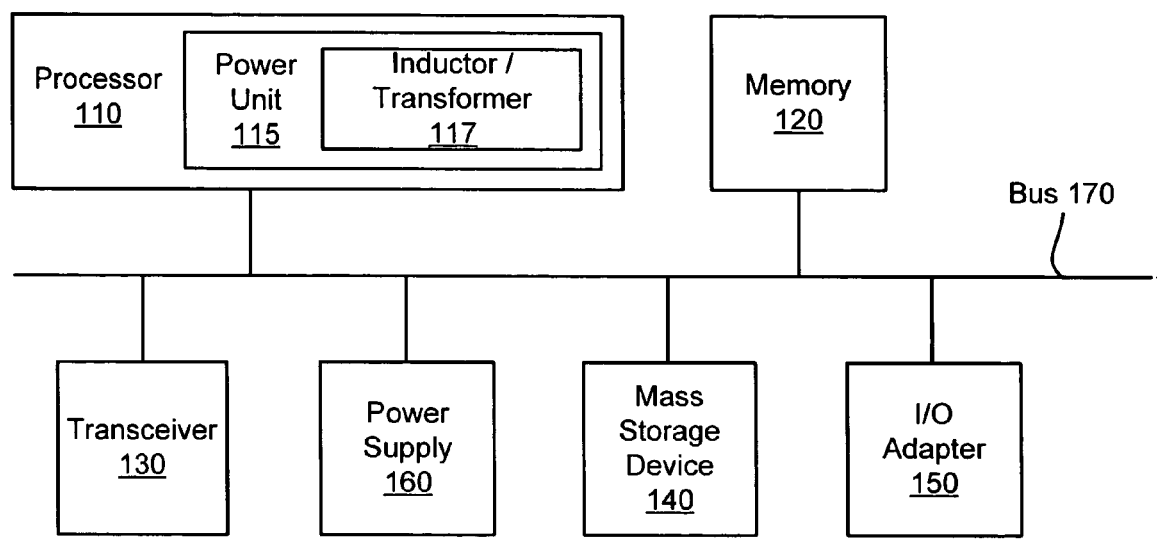
FIG. 1 illustrates a block diagram of a system of an embodiment

Embodiments of a magnetic via, the control of eddy currents in inductors and transformers in integrated circuits thereby, and the method of manufacture thereof will be described. Reference will now be made in detail to a description of these embodiments as illustrated in the drawings. While the embodiments will be described in connection with these drawings, there is no intent to limit them to drawings disclosed herein. On the contrary, the intent is to cover all alternatives, modifications, and equivalents within the spirit and scope of the described embodiments as defined by the accompanying claims.

Simply stated, an embodiment is a magnetic via. More specifically, an embodiment is a magnetic via that increases the inductance of, for example, an integrated inductor or transformer while mitigating eddy currents therein that may limit the operation of the inductor or transformer at high frequency. An inductor or transformer including the magnetic via of an embodiment may include a plurality of metal lines substantially or completely surrounded by a magnetic material or multiple layers of magnetic material. The magnetic via of an embodiment may magnetically couple two layers of magnetic material to complete the magnetic circuit for the magnetic flux. An embodiment may employ chemical mechanical polishing (CMP), dry etching, and electroplating and/or electroless plating techniques to form the layer or layers of magnetic material.

FIG. 1 illustrates a partial block diagram for a device 100. Device 100 may comprise several elements, components or modules, collectively referred to herein as a "module." A module may be implemented as a circuit, an integrated circuit, an application specific integrated circuit (ASIC), an integrated circuit array, a chipset comprising an integrated circuit or an integrated circuit array, a logic circuit, a memory, an element of an integrated circuit array or a chipset, a three-dimensional (3-D) stacked integrated circuit array, a processor, a digital signal processor, a programmable logic device, code, firmware, software, and any combination thereof. Although FIG. 1 is shown with a limited number of modules in a certain topology, it may be appreciated that device 100 may include more or less modules in any number of topologies as desired for a given implementation. The embodiments are not limited in this context.

In one embodiment, device 100 may comprise a mobile device. For example, mobile device 100 may comprise a computer, laptop computer, ultra-laptop computer, handheld computer, cellular telephone, personal digital assistant (PDA), wireless PDA, combination cellular telephone/PDA, portable digital music player, pager, two-way pager, mobile subscriber station, and so forth. The embodiments are not limited in this context.

In one embodiment, device 100 may include a processor 110. Processor 110 may be implemented using any processor or logic device, such as a complex instruction set computer (CISC) microprocessor, a reduced instruction set computing (RISC) microprocessor, a very long instruction word (VLIW) microprocessor, a processor implementing a combination of instruction sets, or other processor device. In one embodiment, for example, processor 110 may be implemented as a general purpose processor, such as a processor made by Intel® Corporation, Santa Clara, Calif. Processor 110 may also be implemented as a dedicated processor, such as a controller, microcontroller, embedded processor, a digital signal processor (DSP), a network processor, a media processor, an input/output (I/O) processor, a media access control (MAC) processor, a radio baseband processor, a field programmable gate array (FPGA), a programmable logic device (PLD), and so forth. The processor of an embodiment may further include on-chip one or more power units 115 to regulate power to the processor 110. Each power unit 115 may include, among other components not illustrated, one or more on-chip inductors 117 as will be described more fully below. In an embodiment, the processor 110 may include multiple power units (each with one or more inductors) that each supply a different voltage to different portions of the processor 110. The embodiments are not limited in this context.

In one embodiment, the device 100 may include a memory 120 to couple to processor 110. Memory 120 may be coupled to processor 110 via bus 170, or by a dedicated bus between processor 110 and memory 120, as desired for a given implementation. Memory 120 may be implemented using any machine-readable or computer-readable media capable of storing data, including both volatile and non-volatile memory. For example, memory 120 may include read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, or any other type of media suitable for storing information. It is worthy to note that some portion or all of memory 120 may be included on the same integrated circuit as processor 110, or alternatively some portion or all of memory 120 may be disposed on an integrated circuit or other medium, for example a hard disk drive, that is external to the integrated circuit of processor 110. The embodiments are not limited in this context.

In various embodiments, device 100 may include a transceiver 130. Transceiver 130 may be any radio transmitter and/or receiver arranged to operate in accordance with a desired wireless protocols. Examples of suitable wireless protocols may include various wireless local area network (WLAN) protocols, including the IEEE 802.xx series of protocols, such as IEEE 802.11a/b/g/n, IEEE 802.16, IEEE 802.20, and so forth. Other examples of wireless protocols may include various wireless wide area network (WWAN) protocols, such as Global System for Mobile Communications (GSM) cellular radiotelephone system protocols with General Packet Radio Service (GPRS), Code Division Multiple Access (CDMA) cellular radiotelephone communication systems with 1xRTT, Enhanced Data Rates for Global Evolution (EDGE) systems, and so forth. Further examples of wireless protocols may include wireless personal area network (PAN) protocols, such as an Infrared protocol, a protocol from the Bluetooth Special Interest Group (SIG) series of protocols, including Bluetooth Specification versions v1.0, v1.1, v1.2, v2.0, v2.0 with Enhanced Data Rate (EDR), as well as one or more Bluetooth Profiles (collectively referred to herein as "Bluetooth Specification"), and so forth. Other suitable protocols may include Ultra Wide Band (UWB), Digital Office (DO), Digital Home, Trusted Platform Module (TPM), ZigBee, and other protocols. The embodiments are not limited in this context.

In various embodiments, device 100 may include a mass storage device 140. Examples of mass storage device 140 may include a hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of DVD devices, a tape device, a cassette device, or the like. The embodiments are not limited in this context.

In various embodiments, the device 100 may include one or more I/O adapters 150. Examples of I/O adapters 150 may include Universal Serial Bus (USB) ports/adapters, IEEE 1394 Firewire ports/adapters, and so forth. The embodiments are not limited in this context.

In one embodiment, device 100 may receive main power supply voltages from a power supply 160 via bus 170. It is to be understood that as illustrated herein, bus 170 may represent both a communications bus as well as a power bus over which the various modules of device 100 may be energized. Further, as introduced with respect to power unit 115 including inductor/transformer 117, and multiple instances thereof within the same processor, power supply 160 may supply, for example, a voltage to the processor 110 that may be converted by the power unit 115 to a different voltage. In an embodiment, the voltage from power supply 160 may be converted to several different voltages by a plurality of power units (e.g., power unit 115) within processor 110 to supply various portions of the processor 110 that may have different voltage requirements.

Figure 2:
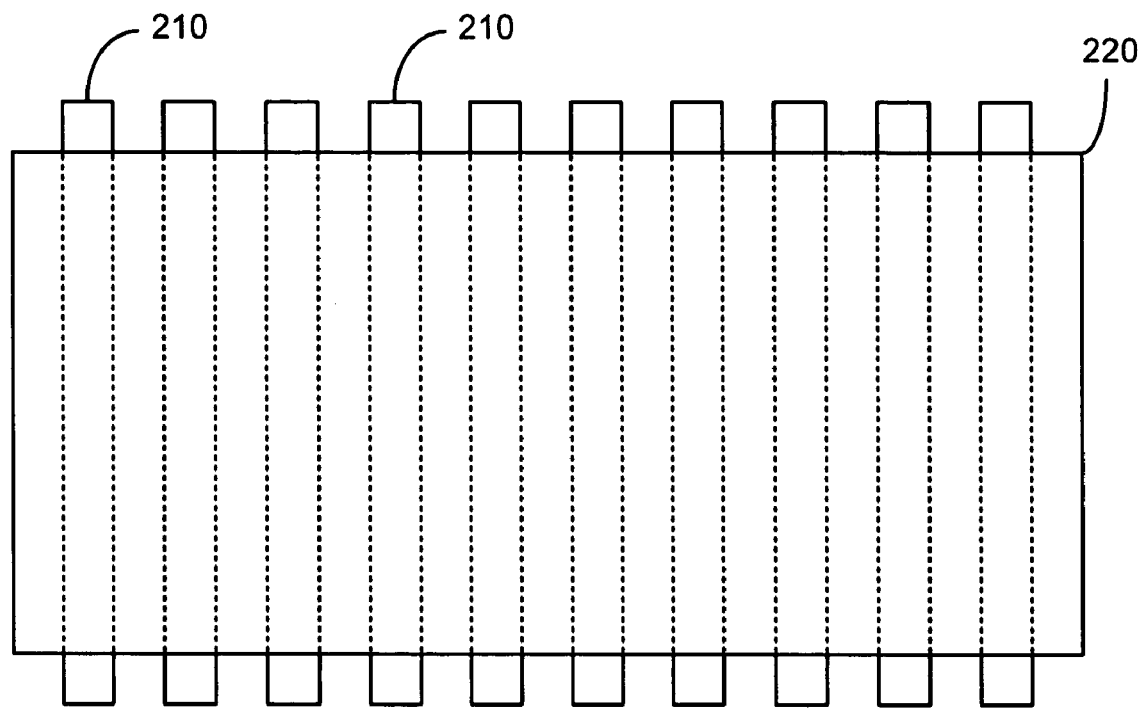
FIG. 2 illustrates a top view of an inductor of an embodiment

FIG. 2 through FIG. 11 more specifically describe, for example, the inductor/transformer 117 including a magnetic via or vias of an embodiment that may be included on the same die as processor 110 or other integrated circuit. For example, FIG. 2 illustrates a simplified top view of an inductor 200 that may be integrated on a die. The inductor 200 may include metal lines (conductors) 210 formed parallel to each other by standard silicon processing techniques directed to forming metal features. Magnetic material 220 may be deposited above and below the parallel metal lines 210, and around the leftmost and rightmost parallel metal lines 210 to form a closed magnetic circuit and to provide a large inductance and magnetic coupling among the metal lines 210. The inclusion of the magnetic material, and the substantial or complete enclosure of the metal lines 210 thereby, may increase the magnetic coupling between the metal lines 210 of the inductor 200 for a given size of the inductor 200. For simplicity, FIG. 2 shows the magnetic material 220 only above the metal lines 210 although the magnetic material may also be below and on the sides of the metal lines 210. Further, magnetic material 220 may include a magnetic via or vias to facilitate the magnetic coupling among various features within the inductor 200.

Figure 3:
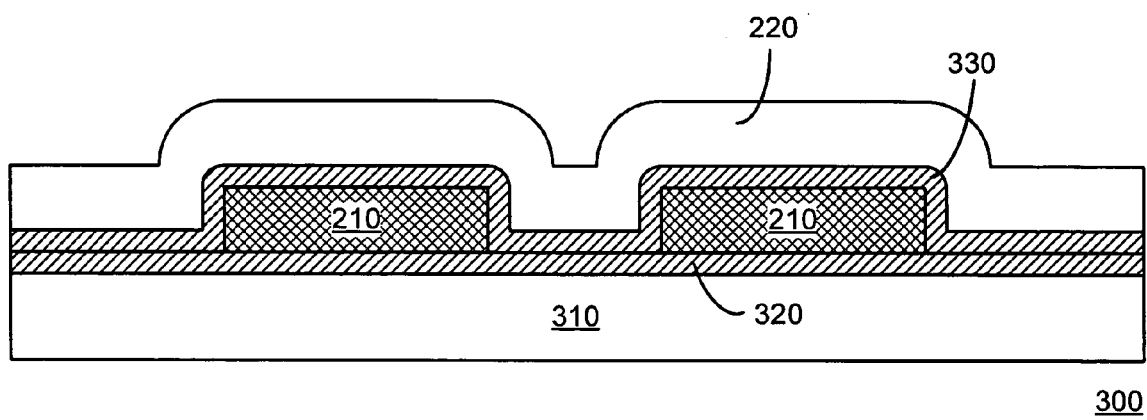
FIG. 3 illustrates a side view of the inductor of FIG. 2
Figure 3:
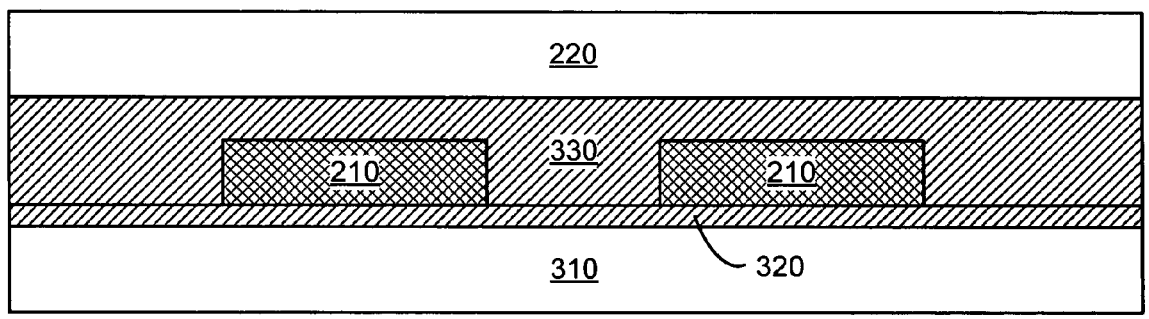

FIG. 3 illustrates a side view of the inductor of FIG. 2 of an embodiment. More specifically, FIG. 3 shows that the metal lines 210 are insulated from each other and from the magnetic material 220 by an insulating material 330 above the metal lines 210, and by insulating material 320 from magnetic material 310 below the metal lines 210. In an embodiment, the insulating materials 320 and 330 may comprise $SiO_2$, SiOF, SiOC, polyimide, a photosensitive insulating material, or any low dielectric constant (low-k) dielectric materials. The magnetic materials 220 and 310 of an embodiment may be CoZrTa, CoZr, CoZrNb, CoZrMo, FeCoAlN, CoP, FeCoP, CoPW, CoBW, CoPBW, CoHf, CoNb, CoW, CoTi, FeCoN, FeTaN, FeCoBSi, FeNi, CoZrO, CoFeHfO, CoFeAlO, CoFeSiO or a combination thereof. The insulating material 320 and 330 deposited around the metal lines 210, and in any end gap in the magnetic material 310 and 220 (if present) may have a smaller magnetic permeability than that of the magnetic material 310 and 220. The smaller magnetic permeability of the insulating material may improve the magnetic coupling between the metal lines 210. For example, the relative permeability of the magnetic material 310 and 220 may be greater than 100 and the relative permeability of the insulating material 320 and 330 may approach 1.

As illustrated by FIG. 3, the metal lines 210 are formed in only one layer. Forming metal lines 210 within one layer may reduce the number of metal levels needed and may further reduce the capacitance between the metal lines 210 versus forming metal lines on top of each other. Further, it is to be understood that an embodiment may include more or fewer metal lines 210 depending on the inductance value required of the inductor 200 and available integrated circuit (e.g., processor 110) real estate that the inductor 300 may occupy.

Also illustrated by FIG. 3 is inductor 301 representing an alternate arrangement of the constituent layers. Of note is the arrangement of the insulating material 330. Compared to inductor 300, the insulating material 330 of inductor 301 may be formed about and above the metal lines 210 to a thickness substantial enough that the surface of the insulating material 330 may thereafter be planarized (e.g., with chemical mechanical polishing, or CMP) while still maintaining a sufficient thickness, for example, above the metal lines 210. The magnetic material 220 may thereafter be formed atop the planarized surface of the insulating material 330.

Figure 4:
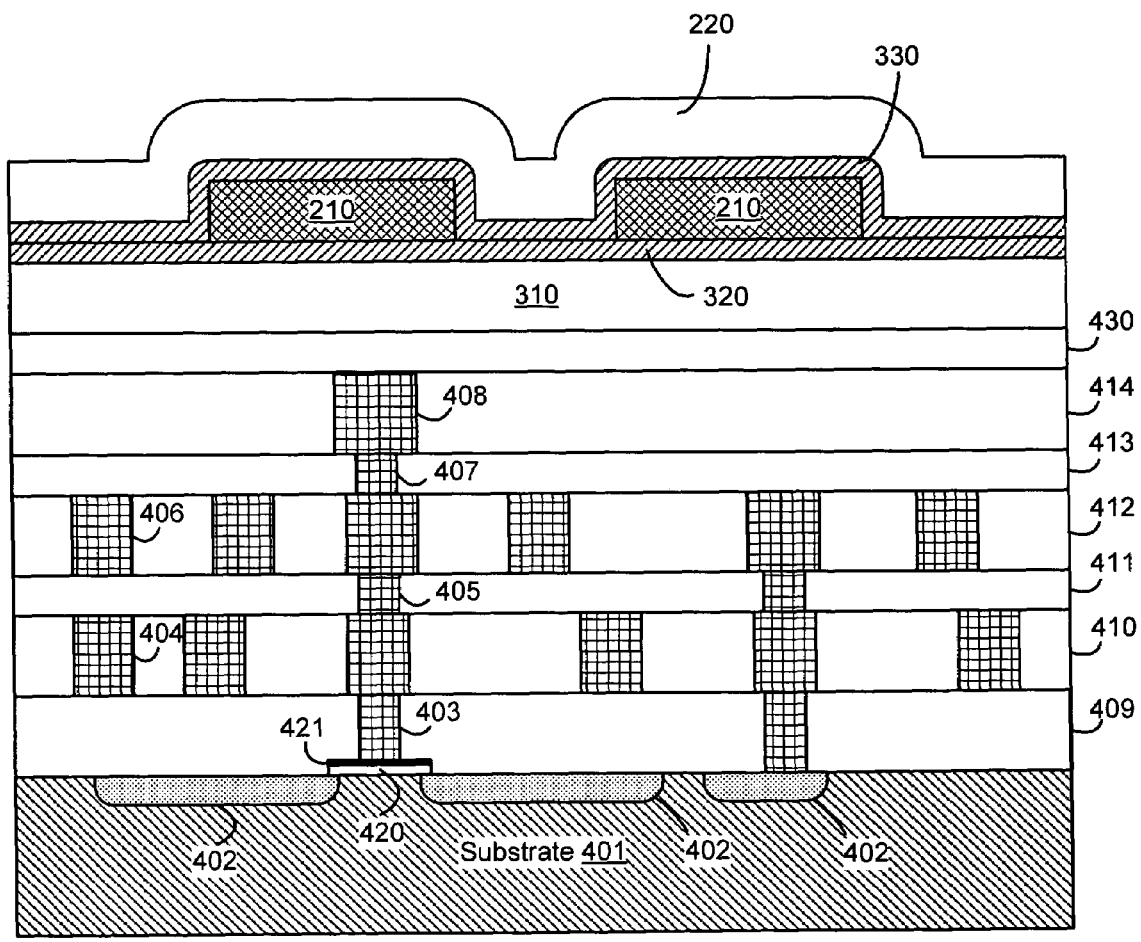
FIG. 4 illustrates a side view of the inductor of FIG. 2 formed on an integrated circuit

FIG. 4 illustrates a side view of the inductor of FIG. 2 formed on an integrated circuit 400. In an embodiment, the integrated circuit 400 has a dual damascene architecture. A substrate 401 contains any variety of semiconductor devices well known to those skilled in the art as represented rudimentarily by source and drain regions 402, dielectric 420, and gate 421 of a metal oxide semiconductor ("MOS") transistor. Interconnect levels 404, 406, and 408 are representative of, for example, the trench level of a dual-damascene interconnect structure, for which via levels 403, 405, and 407 provide electrical contact between interconnect layers and between interconnect layers and semiconductor devices. ILD layers 409 through 414 are formed of, for example, a low-k dielectric material. The ILDs not only isolate interconnects on different layers, but also isolate interconnects on the same layer. It is to be understood that there may be more or fewer interconnect levels depending on the nature and complexity of the fabricated devices as is well known in the art. Further, while illustrated as, for example, inductor 300 it is to be understood that inductor 301 may similarly be formed as part of the integrated circuit 400.

Figure 5:
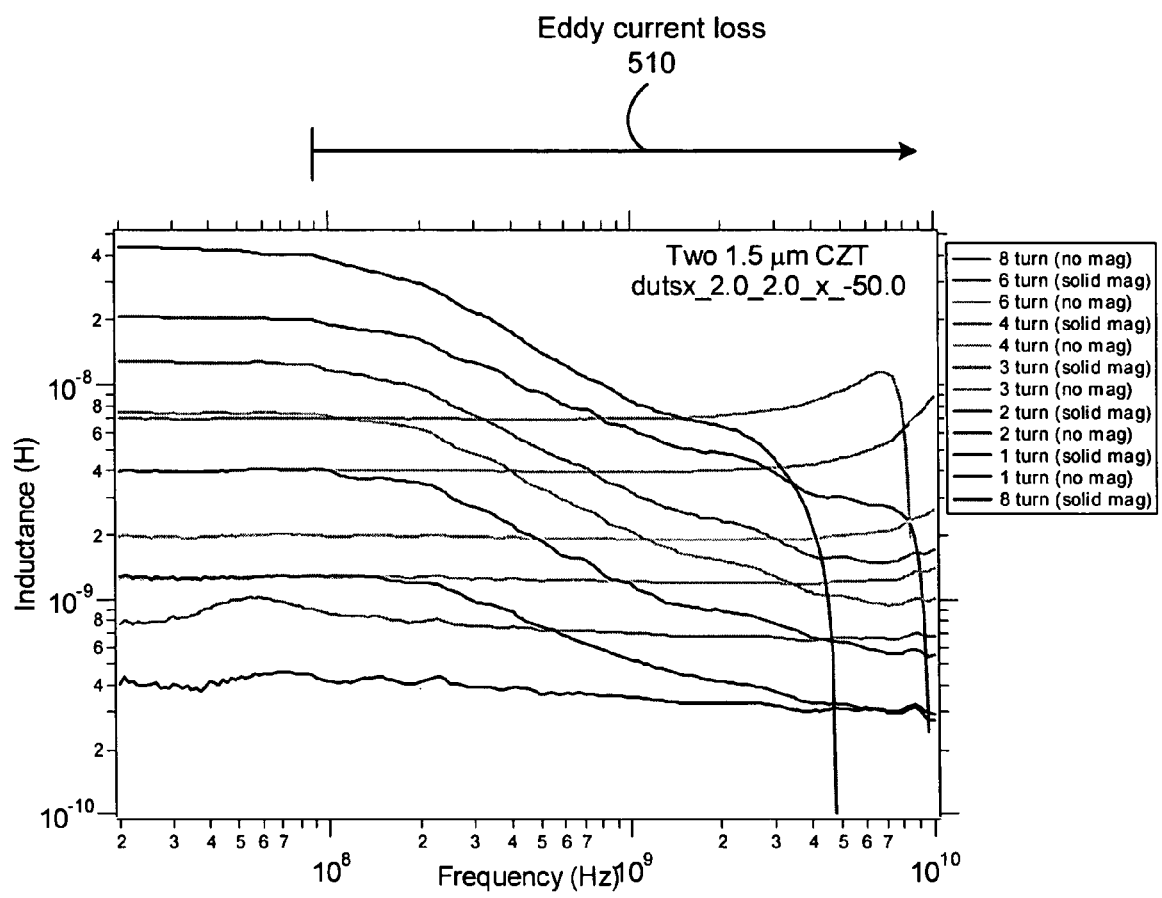
FIG. 5 illustrates a graph of frequency versus inductance for inductors of embodiments

FIG. 5 illustrates a graph of frequency versus inductance for inductors of embodiments. Inductors (e.g. inductor 200 of an embodiment) including magnetic materials are useful for RF and wireless circuits as well as power converters and EMI noise reduction. Integrated on-die DC-DC converters may be important for controlling the power consumption in multicore and many core processor applications. For example, the inductor 200 of an embodiment may be included in an on-chip integrated DC-DC converter at high power levels of approximately 100 W or more that may supply power to a processor, chipset, or other circuits. However, as inductor 200 operates at higher frequencies, the inductor may experience an eddy current related loss 510 from increased resistance causing the inductor 200 to exhibit an apparent reduction in inductance.

More specifically, the eddy current loss 510 region illustrates the loss as a downward slope of the inductance value as operating frequency increases. The eddy current loss becomes particularly cumbersome as the thickness of the magnetic material (e.g., magnetic materials 310 and 220) increases. Said alternatively, as noted voltage converters are one possible application for inductors with magnetic materials. The length of the wires that make up inductors for power converters should to be as short as possible to reduce resistive losses. Accordingly, the operating frequency should be increased to reduce the required inductance. Further, the magnetic material (e.g., magnetic materials 310 and 220) should be thick to obtain more inductance per unit area for efficient voltage conversion. As noted, the thicker magnetic materials together with higher frequencies may increase eddy current loss as thicker materials may have a lower resistance.

Figure 6:
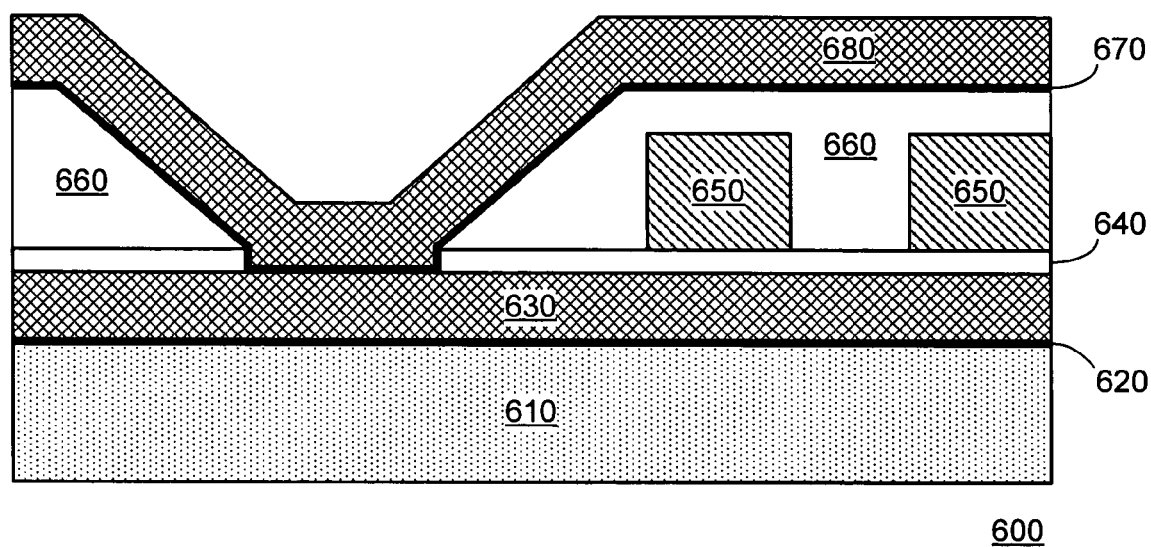
FIG. 6 illustrates a side view of a magnetic via of an embodiment

FIG. 6 illustrates a side view of an inductor 600 including a magnetic via of an embodiment. Though illustrated as part of inductor, the magnetic via may further be included in an on-chip transformer. As noted, as the thickness of the magnetic material (e.g. magnetic material 310 and 220) is increased to increase inductance, the resistance decreases and eddy current losses may offset at least a portion of the increased inductance. The magnetic via of an embodiment may increase, for example, the inductance of inductor 600 and may further decrease the eddy currents within the inductor. Accordingly, an inductor 600 including the magnetic via of an embodiment may exhibit improved inductance, and in particular at higher frequencies at which eddy current losses may otherwise be significant.

More specifically, an effective method to increase the inductance of, for example, a wire, is to surround the wire with magnetic material. A single layer of magnetic material adjacent to a wire may increase the inductance of a wire. Inductance is further increased if the magnetic material surrounds the wire. In a planar technology such as used for CMOS, two magnetic layers may be formed with the wire between. To increase the inductance, the two magnetic layers should contact to complete the magnetic circuit so that substantially no magnetic flux is lost. Said alternatively, without a good magnetic connection between the two magnetic layers, the magnetic flux will escape resulting in significant loss in inductance. As used herein, magnetic via refers to the region where the two magnetic layers couple to each other to complete the magnetic circuit for the magnetic flux.

In an embodiment, insulator 610 may be $SiO_2$, SiN, SiOF, SiOC, polyimide, a photosensitive insulating material, or any other low dielectric constant interlayer dielectric (low-k ILD). An adhesion layer 620 may be formed adjacent to the insulator 610. In an embodiment, adhesion layer 620 may be Ti, Ta, TiN, air exposed Ti, TaN, or CoTi and may have a thickness approximately between 5 and 20 nanometers. A first layer of magnetic material 630 may be formed adjacent to the adhesion layer 620. In an embodiment, the first layer of magnetic material 630 may be CoZrTa, CoZr, CoZrNb, CoZrMo, FeCoAlN, CoP, FeCoP, CoPW, CoBW, CoPBW, CoHf, CoNb, CoW, CoTi, FeCoN, FeTaN, FeCoBSi, FeNi, CoZrO, CoFeHfO, CoFeAlO, CoFeSiO, or a combination thereof. An insulator 640 may thereafter be formed by depositing a blanket layer of, for example $SiO_2$, SiN, SiOF, SiOC, polyimide, a photosensitive insulating material, or any other low-k ILD. Metal lines 650 may be formed on the insulator 640 and thereafter surrounded by another insulator 660. In an embodiment, the insulator 660 may be $SiO_2$, SiN, SiOF, SiOC, polyimide, a photosensitive insulating material, or any other low-k ILD. A patterned etch through insulator 660 and insulator 640 exposes a contact to the first layer of magnetic material 630. Having exposed the first layer of magnetic material 630, a second layer of magnetic material 680 may be deposited, in an embodiment following the formation of an adhesion layer 670, to form a magnetic via. In an embodiment, the second layer of magnetic material 680 may be CoZrTa, CoZr, CoZrNb, CoZrMo, FeCoAlN, CoP, FeCoP, CoPW, CoBW, CoPBW, CoHf, CoNb, CoW, CoTi, FeCoN, FeTaN, FeCoBSi, FeNi, CoZrO, CoFeHfO, CoFeAlO, CoFeSiO, or a combination thereof. Further, in an embodiment, the first layer of magnetic material 630 may extend past the magnetic via opposite of the metal lines 650. However, the extension or overhang may be small to further limit eddy currents within the inductor 600. In an embodiment, the first layer of magnetic material 630 may only extend past the magnetic via by approximately less than or equal to 5.0 microns. In a further embodiment, the first layer of magnetic material 630 may extend beyond the magnetic via by approximately between 1.0 and 5.0 microns.

Figure 7:
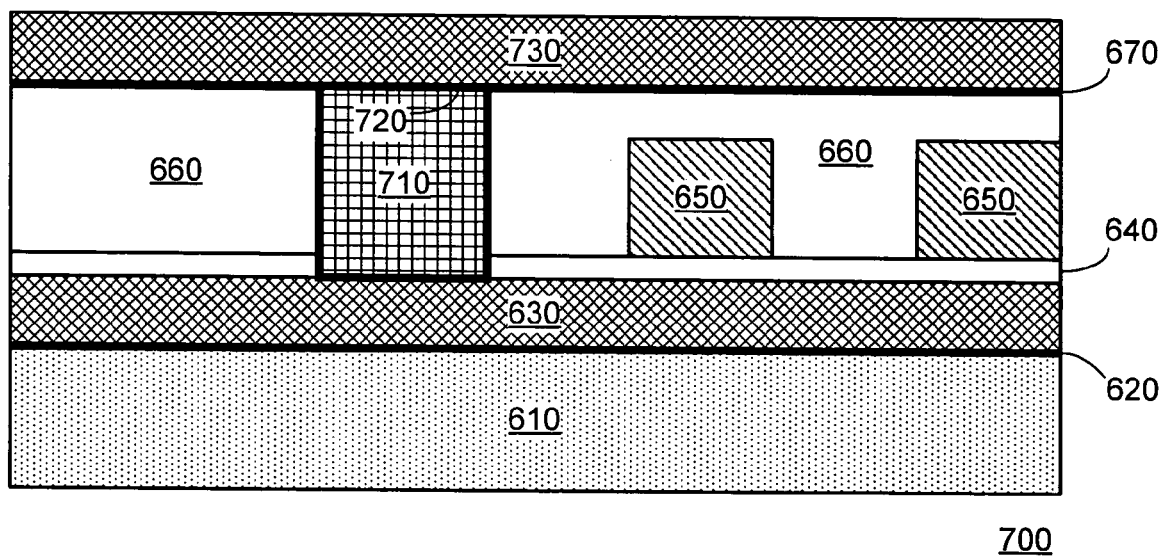
FIG. 7 illustrates a side view of a magnetic via of an alternate embodiment.

FIG. 7 illustrates an alternate embodiment that may mitigate eddy currents within, for example, inductor 700. A magnetic via should have a low reluctance and minimal resistance to best couple two magnetic layers. However, the decreased resistance may cause larger eddy currents. Through the formation of insulator 660, the structure and process of inductor 700 may be substantially the same as inductor 600. Thereafter, the location of the via may be etched with an anisotropic etch to form a magnetic via opening with a higher aspect ratio than the magnetic via etch of inductor 600. Following the formation of adhesion layer 670, in an embodiment Ti, Ta, TiN, air exposed Ti, TaN, or CoTi and approximately between 5 and 20 nanometers thick, a magnetic via 710 may be deposited in the etched region. In an embodiment, the material of magnetic via 710 differs from the first layer of magnetic material 630. For example, the material of magnetic via 710 may have a higher resistivity or saturation magnetization compared to the first layer of magnetic material 630. In an embodiment, the magnetic via may be a material that is insulating such as CoZrO, CoFeHfO, CoFeAlO, or other oxides. The magnetic via 710 may further be an electroplated material that has a higher saturation magnetization than the first layer of magnetic material 630 such as FeCoBW, CoFeP, CoFe, FeCoN or other compounds including iron as iron has a higher saturation magnetization than cobalt and nickel. The reduced shunt inductance that may accompany the use of iron-containing compounds may be offset at least in part by widening the via (e.g., forming a larger via). The width, however, may not be too large as eddy currents may increase. Accordingly, an embodiment balances magnetic via 710 material, size, and location to improve the inductance of, for example, inductor 700

After the magnetic via 710 material has been deposited, it may be planarized, for example by CMP, to expose the surface of insulator 660 and further define the magnetic via 710. Alternatively, if deposited with electroplating or electroless plating, the magnetic via 710 may be selectively formed only on the surface of exposed magnetic material 630 (or the adhesion layer 670). Once the magnetic via 710 has been formed, another adhesion layer 720 may be formed on the surface of the magnetic via. Thereafter, magnetic material 730 may be formed to, in conjunction with magnetic material 630 and magnetic via 710, surround the metal wires 650 to improve the inductance of inductor 700 as described above.

Though illustrated as a single magnetic via 710, it is to be understood that the magnetic via 710 may further be formed as a series of multiple vias versus one continuous via. Multiple instances of a magnetic via 710 of an embodiment, each with smaller dimensions, may serve to maintain the magnetic coupling of the first and second layers of magnetic materials 630 and 730 respectively while further decreasing the eddy current that flow within individual magnetic vias 710. Conversely, a single magnetic via 710 may be used to increase the inductance of the magnetic via 710 and thereby reduce the shunt inductance generated by the magnetic via 710. The selection of single or multiple magnetic vias 710 and the dimensions thereof may offer the ability to tune the inductor 700 for a desired inductance within an operating frequency range (i.e., balancing shunt inductance and eddy current losses, among other factors).

As noted, the material of magnetic via 710 may be different than that of the first and second layers of magnetic materials 630 and 730 respectively. Further, the magnetic via 710 may itself have multiple materials laminated together or multiple laminations of the same material separated by thin insulators. In an embodiment, the magnetic via 710 may be formed and followed by an etchback. The etchback may open up more insulator surrounding the magnetic via 710 into which may be deposited another material. The deposition and etchback processes may be repeated for additional laminations. The result is a magnetic via 710 that may have multiple laminations that are vertically oriented (i.e., the interface plane between the laminations is substantially perpendicular to the plane of the substrate on which, for example, inductor 700 is formed).

Figure 8:
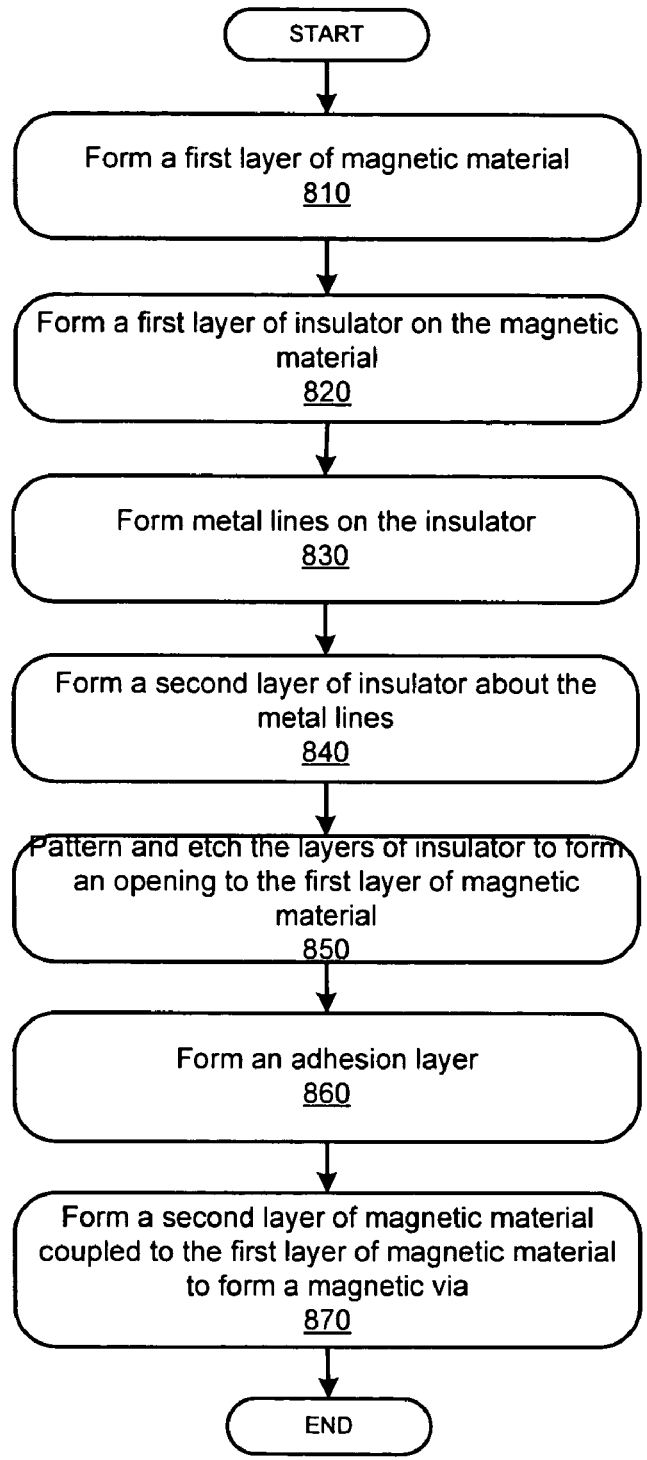
FIG. 8 illustrates a process flow of an embodiment

FIG. 8 illustrates the process flow of an embodiment to form, for example, inductor 600. At 810, a first layer of magnetic material is formed. The first layer of magnetic material may be CoZrTa, CoZr, CoZrNb, CoZrMo, FeCoAlN, CoP, FeCoP, CoPW, CoBW, CoPBW, CoHf, CoNb, CoW, CoTi, FeCoN, FeTaN, FeCoBSi, FeNi, CoZrO, CoFeHfO, CoFeAlO, CoFeSiO, or a combination thereof. At 820, a first layer of insulator is formed on the first layer of magnetic material. The first layer of insulator may be $SiO_2$, SiN, SiOF, SiOC, polyimide, a photosensitive insulating material, or any other low-k ILD. Thereafter, at 830 metal lines are formed on the first layer of insulator. At 840, a second layer of insulator, in an embodiment comprising the same material as the first layer of insulator, is formed about the metal lines. In an embodiment, the metal lines are substantially or completely surrounded by both the first and second layers of insulator. At 850, adjacent to but not directly above a metal line, the two layers of insulator are patterned and etched to form an opening to the first layer of magnetic material. In an embodiment, the etch is an isotropic etch. At 860, an adhesion layer is formed on the second layer of insulator and the exposed first layer of magnetic material. In an embodiment, the adhesion layer is Ti, Ta, TiN, air exposed Ti, TaN, or CoTi and is approximately between 5 and 20 nanometers thick. At 870, a second layer of magnetic material is formed on the surface of the second layer of insulator and the exposed first layer of magnetic material. The second layer of magnetic material may be CoZrTa, CoZr, CoZrNb, CoZrMo, FeCoAlN, CoP, FeCoP, CoPW, CoBW, CoPBW, CoHf, CoNb, CoW, CoTi, FeCoN, FeTaN, FeCoBSi, FeNi, CoZrO, CoFeHfO, CoFeAlO, CoFeSiO, or a combination thereof. In an embodiment, the second layer of magnetic material couples to the first layer of magnetic material to form a magnetic via. As noted, the magnetic via completes the magnetic circuit between the first layer of magnetic material and the second layer of magnetic material thereby reducing the amount of magnetic flux lost.

Figure 9:
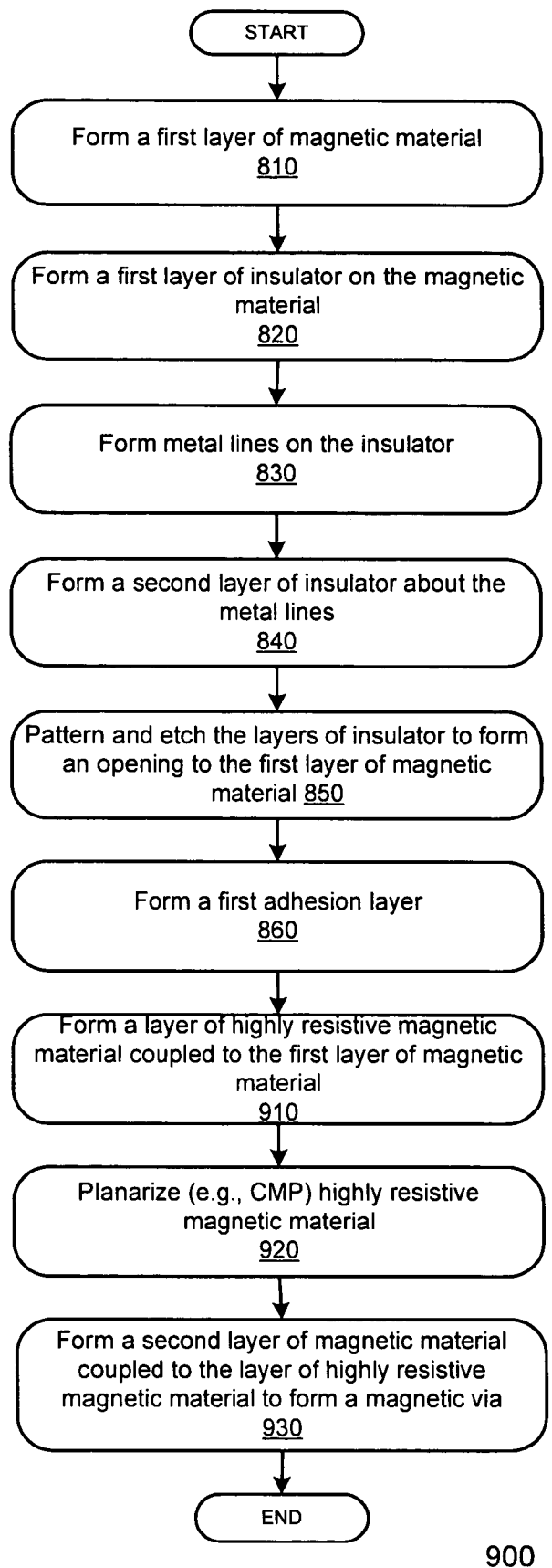
FIG. 9 illustrates a process flow of an alternate embodiment

FIG. 9 illustrates the process flow of an embodiment to form, for example, inductor 700. The process flow substantially mirrors the process flow of FIG. 8 for processes 810-860. At 910, once the layers of insulator have been patterned and etched and the adhesion layer has been formed, a layer of highly resistive magnetic material is formed. In an embodiment, the highly resistive magnetic material couples to the first layer of magnetic material. The highly resistive magnetic material 710 may further be an electroless plated or electroplated material that has a higher saturation magnetization than the first layer of magnetic material 630 In an embodiment, the highly resistive magnetic material may be FeCoBW, CoFeP, CoFe, FeCoN or other compounds including iron as iron has a higher saturation magnetization than cobalt and nickel. Further, the highly resistive magnetic material may be a material that is insulating such as CoZrO, CoFeHfO, CoFeAlO, CoFeSiO, or other oxides. At 920, the highly resistive magnetic material is planarized (e.g., by CMP) to substantially or completely isolate the highly resistive magnetic material to the region etched in the layers of insulator. Thereafter, another adhesion layer may be formed. In an embodiment, the adhesion layer may be Ti, Ta, TiN, air exposed Ti, TaN, or CoTi. Thereafter, at 930, a second layer of magnetic material is formed. The second layer of magnetic material may be CoZrTa, CoZr, CoZrNb, CoZrMo, FeCoAlN, CoP, FeCoP, CoPW, CoBW, CoPBW, CoHf, CoNb, CoW, CoTi, FeCoN, FeTaN, FeCoBSi, FeNi, CoZrO, CoFeHfO, CoFeAlO, CoFeSiO, or a combination thereof. In an embodiment, the second layer of magnetic material couples to the highly resistive magnetic material to form a magnetic via. As noted, the magnetic via completes the magnetic circuit between the first layer of magnetic material and the second layer of magnetic material thereby reducing the amount of magnetic flux lost.

Figure 10:
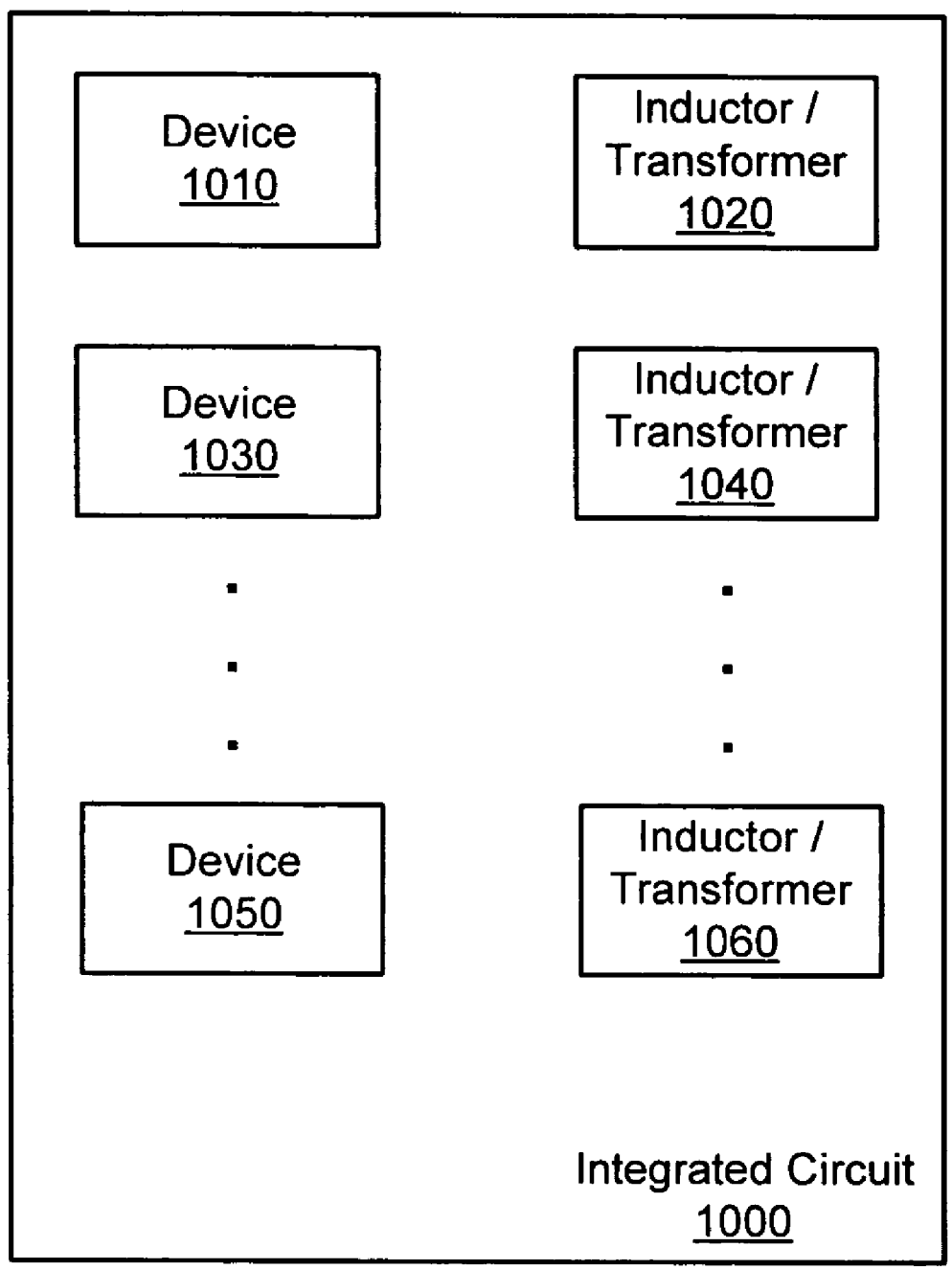
FIG. 10 illustrates a block diagram of an integrated circuit including an inductor of an embodiment

FIG. 10 illustrates a block diagram of an integrated circuit 1000 including an inductor and/or transformer of an embodiment. More specifically, FIG. 10 illustrates that one or more inductor/transformers (e.g., inductor/transformers 1020, 1040, and 1060) may be integrated in an integrated circuit 1000 with any suitable one or more integrated circuit devices, such as integrated circuit devices 1010, 1030, and 1050. Each inductor/transformer 1020, 1040, and 1060 may be structured and fabricated as described above. Although illustrated as having three inductor/transformers, the integrated circuit 1000 of an embodiment may be fabricated with any suitable number of one or more inductor/transformers.

Figure 11:
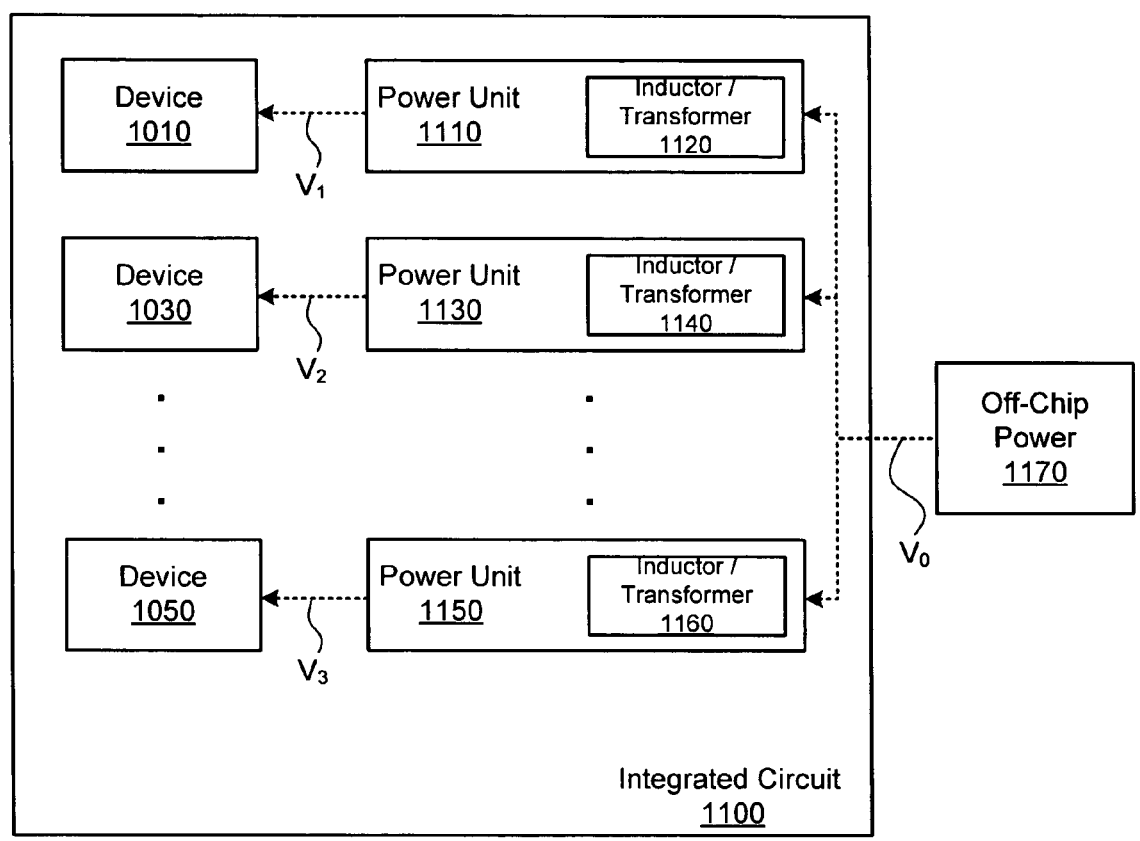
FIG. 11 illustrates a block diagram of an integrated circuit including an inductor of an embodiment as part of a power unit

FIG. 11 illustrates a block diagram of an integrated circuit 1100 including an inductor/transformer of an embodiment as part of a power unit. More specifically, FIG. 1100 shows that one or more power units 1110, 1130, and 1150, including inductor/transformers 1120, 1140, and 1160 respectively, may be integrated in an integrated circuit 1100 with any suitable one or more integrated circuit devices, such as integrated circuit devices 1010, 1030, and 1050. Each inductor/transformer 1120, 1140, and 1160 may be structured and fabricated as described above. Although illustrated as having three inductor/transformers, the integrated circuit 1100 of an embodiment may be fabricated with any suitable number of one or more inductor/transformers. Further illustrated is off-chip power 1170 that provides a voltage of $V_0$ to each power unit. The power units 1110, 1130, and 1150, including inductor/transformers 1120, 1140, and 1160 respectively, may each convert $V_0$ to a different voltage (e.g., $V_1$, $V_2$, and $V_3$). Integrating the power unit(s) into the integrated circuit 1000 die may allow the off-chip power 1170 to supply a higher voltage as the power units 1110, 1130, and 1150 may convert the higher input voltage to lower, regulated voltages on the integrated circuit 1100 die closer to the integrated circuit devices that require the regulated voltages.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

It is also worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Some embodiments may be implemented using an architecture that may vary in accordance with any number of factors, such as desired computational rate, power levels, heat tolerances, processing cycle budget, input data rates, output data rates, memory resources, data bus speeds and other performance constraints. For example, an embodiment may be implemented using software executed by a general-purpose or special-purpose processor. In another example, an embodiment may be implemented as dedicated hardware, such as a circuit, an application specific integrated circuit (ASIC), Programmable Logic Device (PLD) or digital signal processor (DSP), and so forth. In yet another example, an embodiment may be implemented by any combination of programmed general-purpose computer components and custom hardware components. The embodiments are not limited in this context.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, also may mean that two or more elements are not in direct contact with each other, but yet still co-operate or interact with each other. The embodiments are not limited in this context.

Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, such as the examples given with reference to FIG. 1. For example, the memory unit may include any memory device, memory article, memory medium, storage device, storage article, storage medium and/or storage unit, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, various types of Digital Versatile Disk (DVD), a tape, a cassette, or the like. The instructions may include any suitable type of code, such as source code, compiled code, interpreted code, executable code, static code, dynamic code, and the like. The instructions may be implemented using any suitable high-level, low-level, object-oriented, visual, compiled and/or interpreted programming language, such as C, C++, Java, BASIC, Perl, Matlab, Pascal, Visual BASIC, assembly language, machine code, and so forth. The embodiments are not limited in this context.

While certain features of the embodiments have been illustrated as described herein, many modifications, substitutions, changes and equivalents will now occur to those skilled in the art. It is therefore to be understood that the appended claims are intended to cover all such modifications and changes as fall within the true spirit of the embodiments.

What is claimed is:

1. An inductor comprising:
   a first layer of magnetic material;
   one or more metal lines formed on the first layer of magnetic material;
   a second layer of magnetic material; and
   one or more magnetic vias to couple the first layer of magnetic material and the second layer of magnetic material to complete a magnetic circuit for a magnetic flux, wherein one or more of the magnetic vias comprises a magnetic material different from the magnetic material of the first and second layer and having a higher resistivity compared to the first layer.

2. The inductor of claim 1 the first layer of magnetic material to extend from the magnetic via away from the one or more metal lines by approximately less than or equal to 5 microns.

3. The inductor of claim 1, the magnetic via further comprising:
   a first layer of insulator formed between the first layer of magnetic material and the metal lines to substantially insulate the metal lines from the first layer of magnetic material; and
   a second layer of insulator formed between the metal lines and the second layer of magnetic material to substantially insulate the metal lines from the second layer of magnetic material.

4. The inductor of claim 3, the magnetic via further comprising:
   a region etched in the first layer of insulator and second layer of insulator at which the first layer of magnetic material magnetically couples to the second layer of magnetic material.

5. The inductor of claim 4, the first layer of magnetic material and the second layer of magnetic material comprising an alloy selected from the group consisting of CoZrTa, CoZr, CoZrNb, CoZrMo, FeCoAlN, CoP, FeCoP, CoPW, CoBW, CoPBW, CoHf, CoNb, CoW, CoTi, FeCoN, FeTaN, FeCoBSi, FeNi, CoZrO, CoFeHfO, CoFeAlO, CoFeSiO, and a combination thereof.

6. An integrated circuit comprising:
   an integrated circuit device; and
   an inductor coupled to the integrated circuit device, the inductor including one or more metal lines disposed between and substantially insulated from a first layer of magnetic material and a second layer of magnetic material; and
   one or more magnetic vias to couple the first layer of magnetic material to the second layer of magnetic material to complete a magnetic circuit for a magnetic flux, wherein one or more of the magnetic vias comprises a magnetic material different from the magnetic material of the first and second layer and having a higher resistivity compared to the first layer.

7. The integrated circuit of claim 6, the first layer of magnetic material and the second layer of magnetic material comprising an alloy selected from the group consisting of CoZrTa, CoZr, CoZrNb, CoZrMo, FeCoAlN, CoP, FeCoP, CoPW, CoBW, CoPBW, CoHf, CoNb, CoW, CoTi, FeCoN, FeTaN, FeCoBSi, FeNi, CoZrO, CoFeHfO, CoFeAlO, CoFeSiO, and a combination thereof.

8. The integrated circuit of claim 7, the magnetic via comprising an alloy different from the alloy of the first layer of magnetic material and the second layer of magnetic material.

9. The integrated circuit of claim 8, the magnetic via comprising a material selected from the group consisting of CoZrO, CoFeHfO, CoFeAlO, CoFeSiO, FeCoBW, CoFeP, CoFe, and FeCoN.

10. The integrated circuit of claim 7, the magnetic via comprising a material different from the alloy of the first layer of magnetic material and the second layer of magnetic material.

11. A system comprising:
    an off-chip power source; and
    an integrated circuit coupled to the off-chip power source, the integrated circuit including one or more power converters, each power converter including an inductor, the inductor including:
    one or more metal lines disposed between and substantially insulated from a first layer of magnetic material and a second layer of magnetic material; and
    one or more magnetic vias to couple the first layer of magnetic material to the second layer of magnetic material to complete a magnetic circuit for a magnetic flux, wherein one or more of the magnetic vias comprises a magnetic material different from the magnetic material of the first and second layer and having a higher resistivity compared to the first layer.

12. The integrated circuit of claim 6, the first layer of magnetic material and the second layer of magnetic material comprising an alloy selected from the group consisting of CoZrTa, CoZr, CoZrNb, CoZrMo, FeCoAlN, CoP, FeCoP, CoPW, CoBW, CoPBW, CoHf, CoNb, CoW, CoTi, FeCoN, FeTaN, FeCoBSi, FeNi, CoZrO, CoFeHfO, CoFeAlO, CoFeSiO, and a combination thereof.

13. The system of claim 11, the integrated circuit further comprising a plurality of integrated circuit devices, each integrated circuit device coupled to the one or more power converters, and each power converter supplying a different voltage.

14. A method comprising:
    forming a first layer of magnetic material;
    forming a first layer of insulator on the first layer of magnetic material;
    forming metal lines on the first layer of insulator;
    forming a second layer of insulator about the metal lines;
    patterning and etching the first and second layers of insulator to expose a portion of the first layer of magnetic material; and
    forming a second layer of magnetic material coupled to a magnetic via to complete a magnetic circuit for a magnetic flux, wherein one or more of the magnetic vias comprises a magnetic material different from the magnetic material of the first and second layer and having a higher resistivity compared to the first layer.

15. The method of claim 14 further comprising:
    forming an adhesion layer.

16. The method of claim 15 further comprising:
    forming the magnetic via in the etched portion of the first and second layers of insulator, the magnetic via coupled to the first layer of magnetic material.

17. The method of claim 16 further comprising:
    planarize, with chemical mechanical polishing, the magnetic via and the second layer of insulator.

18. The method of claim 16, the magnetic via comprising a material selected from the group consisting of CoZrO, CoFeHfO, FeCoBW, CoFeSiO, FeCoBW, CoFeP, CoFe, and FeCoN.

19. The method of claim 14, the first layer of magnetic material and the second layer of magnetic material comprising an alloy selected from the group consisting of CoZrTa, CoZr, CoZrNb, CoZrMo, FeCoAlN, CoP, FeCoP, CoPW, CoBW, CoPBW, CoHf, CoNb, CoW, CoTi, FeCoN, FeTaN, FeCoBSi, FeNi, CoZrO, CoFeHfO, CoFeAlO, CoFeSiO, and a combination thereof.

* * * * *